United States Patent [19]

Eisfeller et al.

[11] Patent Number: 5,320,869
[45] Date of Patent: Jun. 14, 1994

[54] METHOD FOR PRODUCING HIGH GLOSS BRIGHT COLORED PLASTIC ARTICLES

[75] Inventors: Richard C. Eisfeller, Greenland; Gerard Vachon, Sommersworth, both of N.H.

[73] Assignee: Davidson Textron Inc., Dover, N.H.

[21] Appl. No.: 986,439

[22] Filed: Dec. 4, 1992

[51] Int. Cl.$^5$ .................. C23C 16/06; C23C 14/04
[52] U.S. Cl. .................. 427/250; 427/307; 427/308; 427/309; 427/407.1; 427/409; 427/412.1
[58] Field of Search .................. 427/407.1, 409, 412.1; 425/250, 307, 308, 309

[56] References Cited

U.S. PATENT DOCUMENTS

| | | | |
|---|---|---|---|
| 2,993,806 | 7/1961 | Fisher et al. | 117/71 |
| 3,992,477 | 11/1976 | Dickie et al. | 260/827 |
| 4,101,698 | 7/1978 | Dunning et al. | 428/31 |
| 4,349,402 | 9/1982 | Parker | 156/233 |
| 4,369,225 | 1/1983 | Manabe et al. | 428/334 |
| 4,407,871 | 10/1983 | Eisfeller | 428/31 |
| 4,431,711 | 2/1984 | Eisfeller | 428/31 |
| 4,524,106 | 6/1985 | Flasck | 428/408 |
| 4,551,387 | 11/1985 | Manabe et al. | 428/336 |
| 4,699,814 | 10/1987 | Ambrose et al. | 427/407.1 |
| 4,713,143 | 12/1987 | Eisfeller | 156/655 |
| 4,911,811 | 3/1990 | Mullaney, Jr. | 204/192.1 |
| 4,923,717 | 5/1990 | Gladfelter et al. | 427/252 |
| 4,956,196 | 9/1990 | Wagner et al. | 427/38 |
| 4,971,841 | 11/1990 | Panush et al. | 427/407.1 |
| 4,975,305 | 12/1990 | Biginelli | 427/354 |

*Primary Examiner*—Asok Pal
*Assistant Examiner*—P. Achutamurthy
*Attorney, Agent, or Firm*—Reising, Ethington, Barnard, Perry & Milton

[57] ABSTRACT

A high gloss color finish for a plastic article is formed by coating and curing a colored primer layer (12) onto a plastic substrate (10). A light transmissive basecoat (14) is applied and cured onto the primer layer (12) to form a substrate (10) with a colored surface. Indium islands (20) are vacuum deposited onto the basecoat (12) to a thickness up to 100 Angstroms to form a visually macroscopically continuous layer (21). The island layer (21) is etched to remove smaller sized islands. A transparent topcoat (24) is applied onto the basecoat and indium islands and cured in place.

13 Claims, 1 Drawing Sheet

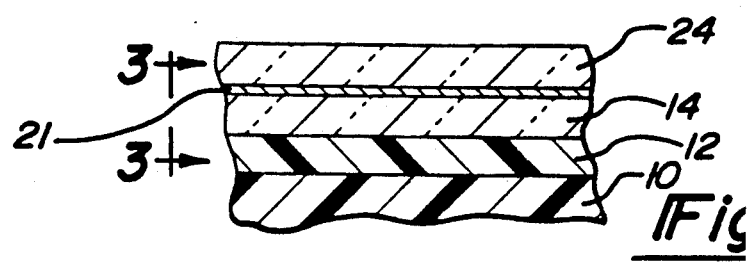

METHOD FOR PRODUCING HIGH GLOSS BRIGHT COLORED PLASTIC ARTICLES

TECHNICAL FIELD

The field of this invention relates to a substrate coated with a high gloss color coating incorporating metallic islands.

BACKGROUND OF THE DISCLOSURE

It has long been desired to produce a high gloss paint system for automotive finishes. Various technologies have been attempted to produce a brilliant reflective color finish that can be applied to plastic material as well as metal surfaces. A high gloss finish gives a wet appearance to the surface without a metallic flake appearance. These technologies varied from trying new high gloss formulas of paint, new processes of applying the paint to the surface such as electrocoating, to adding metallic flakes to the liquid paint resin. The consuming public, has long been desirous of having a rich glossy finish coating often having a highly polished appearance.

It has been known to produce bright chrome finishes to provide a mirror-like finish on a plastic substrate to substitute for chrome metal parts. Some of these technologies use vacuum depositing of metal film or discrete islands onto the plastic substrate and covering the metal with a clear resinous top coat. Processes for producing bright chrome metallic finishes have been taught in U.S. Pat. Nos. 4,407,871; 4,431,711; and 4,713,143.

Elastomeric materials are also desired to substitute for conventional metal parts. The coating on elastomeric materials must have the same gloss and luster and otherwise correctly match the color applied onto other metal components.

What is desired is a high gloss colored finish and a process for making the high gloss color finish that incorporates the vacuum deposition of metallic islands on a plastic color substrate and allows a color layer underneath to be visible and enhanced therethrough.

SUMMARY OF THE DISCLOSURE

In accordance with one aspect of the invention, a process for applying a high gloss color coating on an article includes the steps of providing a colored surface on a substrate and vacuum depositing discrete thin islands of a low melting metal having a thickness up to approximately 100 Angstroms on the substrate. The metal preferably has a melting point between 100 degrees C. to 350 degrees C., preferably between 125 degrees C. to 150 degrees C.

The islands are formed to visually appear macroscopically as a continuous film while having spaces commonly referred to as channels between the discrete islands where the colored surface of the substrate remains visible through the spaces and through the thin islands. The vacuum deposited material is etched with a solvent to remove smaller islands that have been deposited on the substrate and the spaces are enlarged through which the colored surface is visible between remaining islands.

A clear resinous protective top coat as a liquid is applied over and between the discrete islands and wets the colored substrate surface. The top coat is dried to a protective film encapsulating the discrete islands and adheres the protective film directly to the colored surface of the substrate.

Preferably, the islands are formed from the group of indium, tin, lead and alloys thereof. The high gloss colored coating having a 60 degree gloss rating in the range of 60 to 200 is achieved. Preferably, the substrate is made from a dielectric material such as an elastomer and has a dielectric resinous colored pigmented coating applied thereon. It is desirous to etch the vacuum deposited material with a solvent to remove smaller islands that have been deposited on said substrate and enlarging the spaces through which the pigmented colored surface is visible between remaining islands before applying the clear resinous protective dielectric top coat as a liquid over and between the discrete islands.

In accordance with another aspect of the invention, a high gloss colored coating for an article includes a substrate having a dielectric colored surface and spaced apart electrically discrete islands thereon of a low melting metal having a macroscopic visual appearance of a continuous film. The thickness of the islands can be up to approximately 100 Angstroms. The thinness of the islands and the spaces existing between the islands allows the transmission of light therebetween onto said dielectric colored surface. A dielectric protective clear resinous top coat is adhered over the islands and insulates the islands from one another and provides for the transmission of light through the top coat and between the islands to the dielectric colored surface of the substrate. The transmission of the colored light from the colored substrate surface and through the channels, islands, and topcoat produces a surprisingly high gloss colored finish without a metallic or chrome-like appearance. The high gloss colored coating desirably has a 60 degree gloss rating in the range of 60 to 200.

BRIEF DESCRIPTION OF THE DRAWINGS

Reference now is made to the accompanying drawings in which.

DETAILED DESCRIPTION OF THE PREFERRED EMBODIMENT

Figure 1:
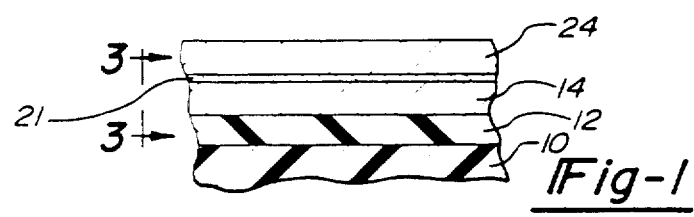
FIG. 1 is a side elevational and schematic view of a high gloss colored finish in accordance with one embodiment of the invention.

Referring now to FIG. 1, a substrate 10 that can be used for automotive components is coated with a colored primer 12 and a transparent basecoat 14. The substrate 10 can be any dielectric type material that P-566 - 6 can be used to receive vacuum deposited metal. It is foreseen that the substrate can be made from a moldable or castable elastomer that is tough and abuse resistant with some flexibility such as an injection molding grade thermoplastic poly-urethane (TPU). The primer coat 12 is a urethane primer that is suitably pigmented to a desired color. The basecoat 14 is a urethane enamel that is light transmissive. Both the primer and the basecoat need to be light stable because the significant amount of ultraviolet light reaching these coatings through the islands could otherwise degrade them. Suitable primer and basecoat materials are described in U.S. Pat. Nos. 4,407,871 and 4,431,711, both which are incorporated herein by reference. In certain other applications the colored primer 12 and transparent basecoat 14 may be substituted by a properly pigmented single layer enamel basecoat. For purposes of this invention, the basecoat and primer layers are considered part of the substrate onto which the subsequently mentioned layers are adhered.

Figure 2:
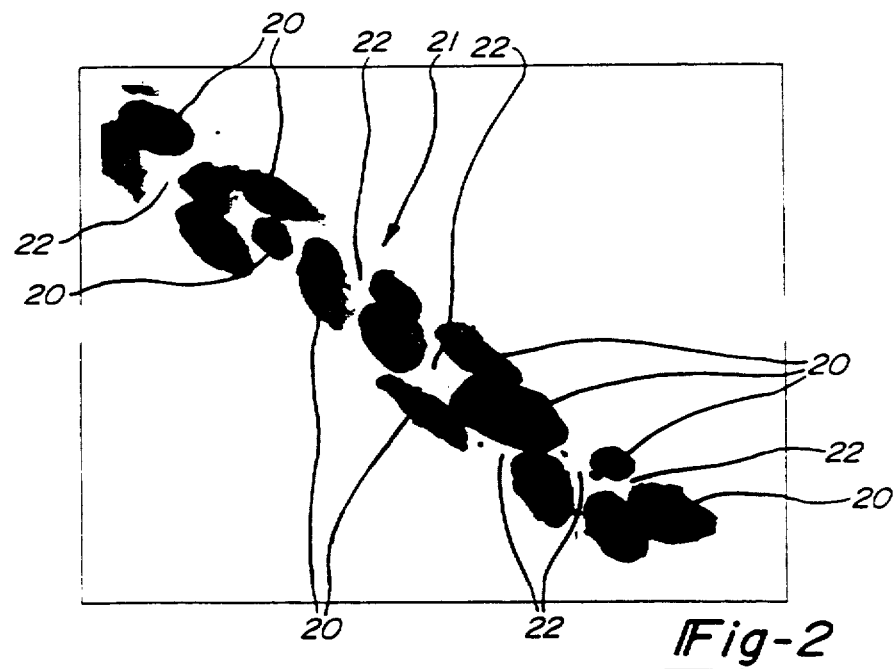
FIG. 2 is a highly enlarged plan view illustrating the islands present in FIG. 10.

Discrete indium islands 20 as schematically shown in FIG. 2 are vacuum deposited onto the basecoat 14 to a thickness of up to 100 Angstroms. The general process of vacuum depositing minute discrete rounded indium islands onto a component is disclosed in U.S. Pat. No. 4,431,711 which is incorporated herein by reference. The discrete islands have a visually macroscopic appearance of being a thin light transmissive cohesive film 21.

The island layer 21 is etched to remove the smaller islands and increasing the space 22, i.e. enlarging the channels between the islands. The steps of etching the island layer is set forth in U.S. Pat. No. 4,713,143 and is also hereby incorporated by reference.

Figure 3:
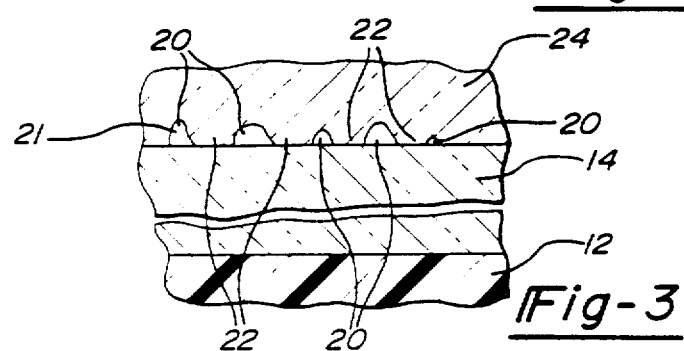
FIG. 3 a highly enlarged side elevational view taken along lines 3—3 shown in FIG. 1.

The primer layer 12, basecoat layer 14, and island layer 21 are then coated by an outer layer of clear resin material in the form of a light transparent liquid topcoat 24. The topcoat 24 fills the spaces 22 in the island layer 21 to wet and directly bond onto the basecoat layer 14 as schematically illustrated in FIG. 3. The topcoat is the cured to form a protective coating.

EXAMPLE NO. 1

Substrate—Thermoplastic urethane (TPU).

Primer—Poly-urethane resin that is pigmented to a desired color is sprayed between a 0.1 and 2.0 mils and then baked for twenty minutes at 250 degrees F. to cure.

Basecoat—A light transmissive poly-urethane resin material is flashed at room temperature for twenty minutes and then baked for approximately thirty minutes at 260 degrees F. to reach a full cure.

Island layer—Indium is vapor deposited to form an island layer up to 100 Angstroms thick in accordance with the teachings of U.S. Pat. No. 4,431,711.

Etching—Ninety seconds at 160 degrees F. in a 10% sodium hydroxide bath.

Topcoat—A transparent poly-urethane resin is applied and flashed for twenty minutes at room temperatures and then baked for approximately thirty minutes at 260 degrees F. for a complete cure.

Variations and modifications are possible without departing from the scope and spirit of the present invention as defined by the appended claims.

The embodiments in which an exclusive property or privilege is claimed are defined as follows.

1. A process for applying a glossy color coating on an article characterized by the steps of;
   providing a colored surface on a substrate;
   vacuum depositing on said substrate to form discrete thin island of a metal having a melting temperature between 100° C. and 350° C. and having a thickness up to approximately 100 Angstroms, said islands formed to visually appear macroscopically as a continuous film while having spaces between said discret islands where said colored surface of said substrate remains visible through said spaces and through said thin islands;
   etching the vacuum deposited material with a solvent which dissolves residuals of metal that have been deposited on said substrate from the spaces between said discrete islands and enlarging the spaces through which said colored surface is visible between remaining islands;
   applying a clear resinous protective top coat as a liquid over and between the discrete islands and wetting the colored substrate surface with said top coat liquid; and
   drying said top coat so applied to a protective film encapsulating said discrete islands and adhering said protective film directly to said colored surface of said substrate.

2. A process as defined in claim 1 further characterized by;
   said islands formed from a metal selected from the group consisting of indium, tin, lead and alloys thereof.

3. A process as defined in claim 2 further characterized by;
   said islands formed from a metal selected from the group consisting of indium and alloys thereof.

4. A process as defined in claim 2 further characterized by;
   said gloss colored coating having a gloss rating in the range of 60 to 200.

5. A process for applying a glossy color coating on an article characterized by the steps of;
   applying and adhering a dielectric colored layer on a dielectric substrate;
   vacuum depositing on said colored coating of said substrate to form discrete thin islands of a metal having a melting temperature between 100° C. and 350° C. and having a thickness up to approximately 100 Angstroms, said islands formed to visually appear macroscopically as a continuous film while having spaces between said discrete islands where said colored surface of said substrate remains visible through said spaces and through said thin islands;
   etching the vacuum deposited material with a solvent which dissolves residuals of metal that have been deposited on said substrate from the spaces between said discrete islands and enlarging the spaces through which said colored surface is visible between remaining islands;
   applying a clear resinous protective dielectric top coat as a liquid over and between the discrete islands and wetting the colored coating with said top coat liquid; and
   drying said top coat so applied to a protective film encapsulating said discrete islands and adhering said protective film directly to said colored coating of said substrate.

6. A process as defined in claim 5 further characterized by;
   said islands formed from a metal selected from the group consisting of indium, tin, lead and alloys thereof.

7. A process as defined in claim 6 further characterized by;
   said high gloss colored coating having a gloss rating in the range of 60 to 200.

8. A process as defined in claim 5 further characterized by;
   said colored layer on said substrate comprising a colored primer applied onto a dielectric substrate and a clear basecoat applied onto said colored primer and allowed to dry and adhere to said substrate before the vacuum deposition of said islands thereon.

9. A high glossy colored coating for an article characterized by;
   a substrate having a dielectric colored surface;

spaced apart electrically discrete islands thereon of a low melting metal having a macroscopic visual appearance of a continuous film, the thickness of the islands being up to approximately 100 Angstroms, and spaces between said islands for allowing the transmission of light therebetween onto said dielectric colored surface; and a dielectric protective clear resinous top coat over said islands and insulating said islands from one another and providing for the transmission of light through the top coat and between said islands to said dielectric colored surface of said substrate.

10. A glossy colored coating as defined in claim 9 further characterized;

said islands formed from a metal selected from the group consisting of indium, tin, lead and alloys thereof.

11. A glossy colored coating as defined in claim 10 further characterized by;

said gloss colored coating having a gloss rating in the range of 60 to 200.

12. A glossy colored coating as defined in claim 11 further characterized by;

said dielectric surface of said substrate being a layer of colored liquid resinous material applied to said substrate and allowed to dry and adhere to said substrate.

13. A glossy colored coating as defined in claim 11 further characterized by;

said dielectric surface of said substrate including a layer of colored liquid resinous primer material applied to said substrate and a clear basecoat applied thereon with both primer and basecoat allowed to dry and adhere to said substrate before the electrically discrete islands are applied thereon.

* * * * *

UNITED STATES PATENT AND TRADEMARK OFFICE
CERTIFICATE OF CORRECTION

PATENT NO. : 5,320,869

DATED : June 14, 1994

INVENTOR(S) : Richard C. Eisfeller, Gerard Vachon

It is certified that error appears in the above-indentified patent and that said Letters Patent is hereby corrected as shown below:

The drawing sheet consisting of Fig. 1 should be deleted and substitute therefor the attached page consisting of Figs. 1-3.

Signed and Sealed this

Twenty-sixth Day of September, 1995

*Attest:*

BRUCE LEHMAN

*Attesting Officer*     *Commissioner of Patents and Trademarks*